(12) United States Patent
Ichino et al.

(10) Patent No.: US 9,613,836 B2
(45) Date of Patent: Apr. 4, 2017

(54) COATING FILM FORMING APPARATUS, COATING FILM FORMING METHOD, AND RECORDING MEDIUM

(71) Applicant: TOKYO ELECTRON LIMITED, Tokyo (JP)

(72) Inventors: Katsunori Ichino, Koshi (JP); Kousuke Yoshihara, Koshi (JP); Yuichi Terashita, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/308,784

(22) Filed: Jun. 19, 2014

(65) Prior Publication Data
US 2015/0004311 A1  Jan. 1, 2015

(30) Foreign Application Priority Data

Jun. 27, 2013  (JP) .................. 2013-135074

(51) Int. Cl.
*B05C 11/08* (2006.01)
*H01L 21/67* (2006.01)
*B05D 1/00* (2006.01)
*G03F 7/16* (2006.01)

(52) U.S. Cl.
CPC .......... *H01L 21/6715* (2013.01); *B05C 11/08* (2013.01); *B05D 1/005* (2013.01); *G03F 7/162* (2013.01)

(58) Field of Classification Search
CPC ................. B05C 11/08; B05D 1/005
See application file for complete search history.

(56) References Cited

U.S. PATENT DOCUMENTS

| | | | | |
|---|---|---|---|---|
| 4,393,807 A * | 7/1983 | Fujimura | ............... | G03F 7/162 118/320 |
| 5,395,649 A * | 3/1995 | Ikeda | ..................... | B05D 1/005 118/50 |
| 6,537,373 B1 * | 3/2003 | Kitano | ............... | H01L 21/6715 118/323 |
| 2007/0254098 A1 * | 11/2007 | Ko | ......................... | B05D 1/005 427/240 |

FOREIGN PATENT DOCUMENTS

| | | |
|---|---|---|
| JP | 8-153668 A | 6/1996 |
| JP | 2005-235950 A | 9/2005 |

* cited by examiner

*Primary Examiner* — Dah-Wei D Yuan
*Assistant Examiner* — Stephen Kitt
(74) *Attorney, Agent, or Firm* — Nath, Goldberg & Meyer; Jerald L. Meyer

(57) ABSTRACT

A coating film forming apparatus includes: a substrate holding unit to horizontally hold a substrate; a rotating mechanism to rotate the substrate held by the substrate holding unit; a coating liquid supplying mechanism to supply coating liquid to form a coating film on the substrate; an annular member to rectify a gas stream above a periphery of the substrate when liquid film of the coating liquid is dried by rotation of the substrate, the annular member being provided above the periphery of the substrate and along a circumferential direction of the substrate so as to cover the periphery of the substrate; and a protrusion provided on an inner periphery of the annular member along circumferential direction of the annular member so as to protrude upward to reduce component of the gas stream flowing directly downward near an inner peripheral edge of the annular member.

5 Claims, 17 Drawing Sheets

------- : Evaluation Test 2-2 (450mm Wafer, with no ring plate)
——·—— : Evaluation Test 2-3 (450mm Wafer, with ring plate)

COATING FILM FORMING APPARATUS, COATING FILM FORMING METHOD, AND RECORDING MEDIUM

CROSS-REFERENCE TO RELATED APPLICATION

This application claims the benefit of Japanese Patent Application No. 2013-135074, filed on Jun. 27, 2013 in the Japan Patent Office, the disclosure of which is incorporated herein in its entirety by reference.

TECHNICAL FIELD

The present disclosure relates to a coating film forming apparatus for forming a coating film on a substrate, a coating film forming method, and a recording medium storing a computer program for use in the coating film forming apparatus.

BACKGROUND

A method referred to as a spin coating has been widely used in forming a coating film, e.g., a resist film, on a substrate due to its a rapid film forming capability. In the spin coating, a back surface of the substrate is held by a spin chuck, and a resist is supplied to a central portion on a surface of the substrate. The substrate is then rotated such that a centrifugal force causes the resist to expand to a periphery of the substrate. Thereafter, the substrate continues to be rotated to dry the resist on the surface of the substrate, thereby forming the resist film.

In order to rapidly dry the resist, the rotational speed of the substrate may be increased to facilitate volatilization of solvent in the resist. However, an upper limit of the rotational speed is limited by the Reynolds number of a gas stream on the substrate. Specifically, as the rotational speed of the substrate increases, the Reynolds number increases. If the Reynolds number exceeds a certain value, a flow of the gas stream on the substrate becomes turbulent. Then, the turbulent flow is transferred onto a surface of the resist film. That is, concave-convex portions are formed on the resist film along the turbulent flow, thus deteriorating an in-plane uniformity of the resist film in a plane of the substrate.

The size of a semiconductor wafer (hereinafter, referred to as a wafer) used as a substrate has been gradually increased and thus it has been proposed to use a wafer having a diameter of, e.g., 450 mm. If the size of the wafer is increased as described above, the upper limit of the rotational speed that may reduce the formation of the concave-convex portions on the periphery of the wafer is lowered, as represented in evaluation tests to be described below. That is, it takes a long time to dry the resist after the resist is applied, thus resulting in a decrease in throughput.

There is a technology in which a ring-shaped plate is provided above a rectangular substrate so as to face corners of the rectangular substrate such that the gas stream on the substrate with the resist applied thereon as described above is rectified. However, such a plate causes the gas stream moving toward an opening of the plate to be rapidly directed downward near an inner peripheral edge of the plate. When the substrate is subjected to a dry process while being exposed to the gas stream directed downward, a dry speed near the inner peripheral edge of the plate in the plane of the substrate is different from those at other positions. As a result, a thickness of the resist film obtained after the dry process is increased locally near the inner peripheral edge.

SUMMARY

Some embodiments of the present disclosure are to provide an enhanced throughput and an increased film thickness uniformity of a coating film in a plane of a substrate when the coating film is formed on the substrate.

According to one embodiment of the present disclosure, a coating film forming apparatus is provided. The coating film forming apparatus includes: a substrate holding unit configured to horizontally hold a substrate; a rotating mechanism configured to rotate the substrate held by the substrate holding unit; a coating liquid supplying mechanism configured to supply coating liquid to form a coating film on the substrate; an annular member configured to rectify a gas stream above a periphery of the substrate when a liquid film of the coating liquid is dried by rotation of the substrate, the annular member being provided above the periphery of the substrate and along a circumferential direction of the substrate so as to cover the periphery of the substrate; and a protrusion provided on an inner periphery of the annular member along a circumferential direction of the annular member so as to protrude upward to reduce a component of the gas stream flowing directly downward near an inner peripheral edge of the annular member.

According to another embodiment of the present disclosure, a coating film forming method is provided. The coating film forming method includes: horizontally holding a substrate by a substrate holding unit; rotating the substrate held by the substrate holding unit using a rotating mechanism; supplying a coating liquid for forming a coating film on the substrate using a coating liquid supplying mechanism; rectifying a gas stream above a periphery of the substrate by an annular member provided above the periphery of the substrate along a circumferential direction of the substrate so as to cover the periphery of the substrate when a liquid film of the coating liquid is dried by rotation of the substrate; and reducing a component of the gas stream flowing directly downward near an inner peripheral edge of the annular member by a protrusion provided on an inner periphery of the annular member along a circumferential direction of the annular member so as to protrude upward.

According to another embodiment of the present disclosure, provided is a non-transitory computer-readable recording medium storing a computer program for use in a coating film forming apparatus for forming a coating film on a substrate, wherein the computer program causes a computer to perform the coating film forming method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
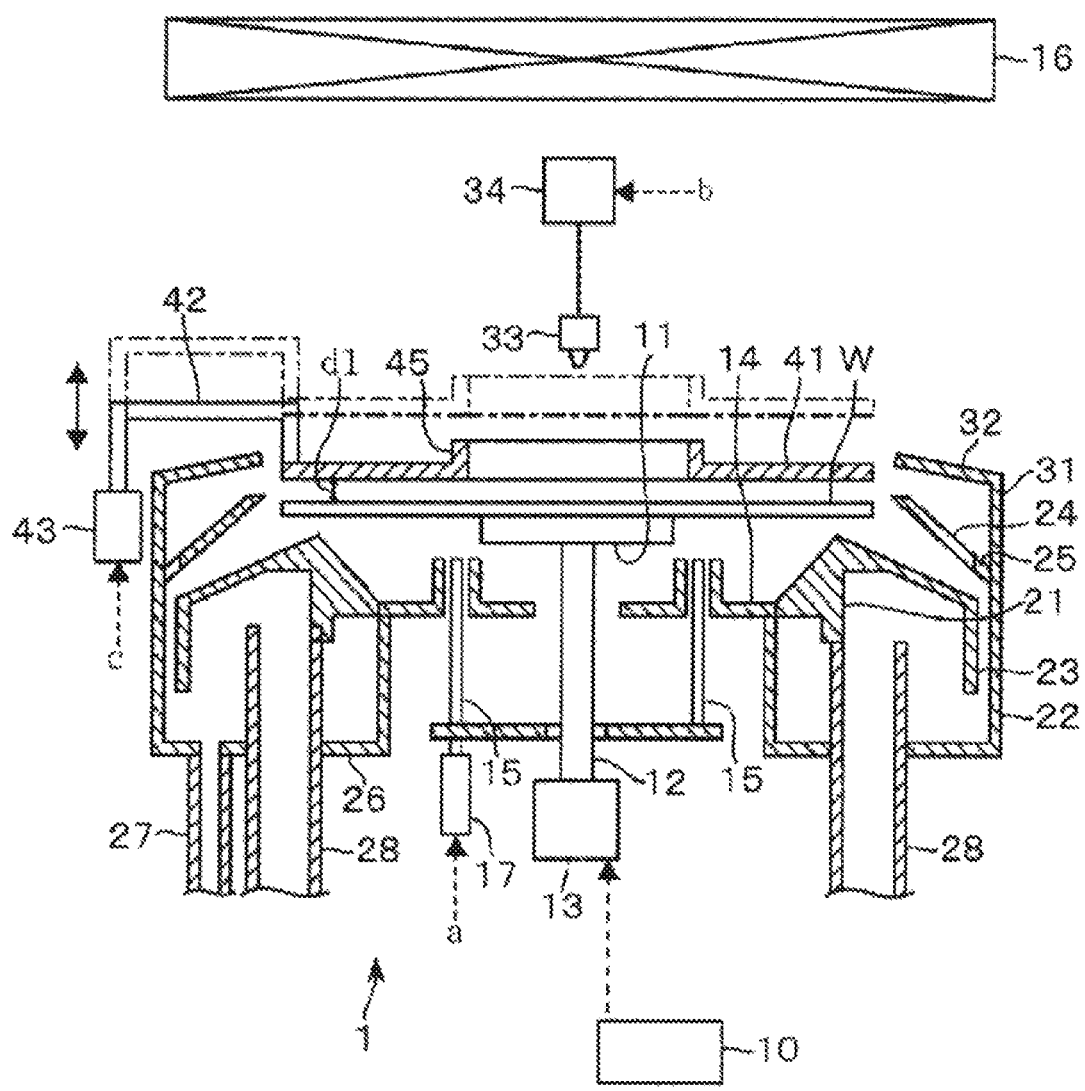
FIG. 1 is a longitudinal sectional view of a resist coating apparatus.
Figure 2:
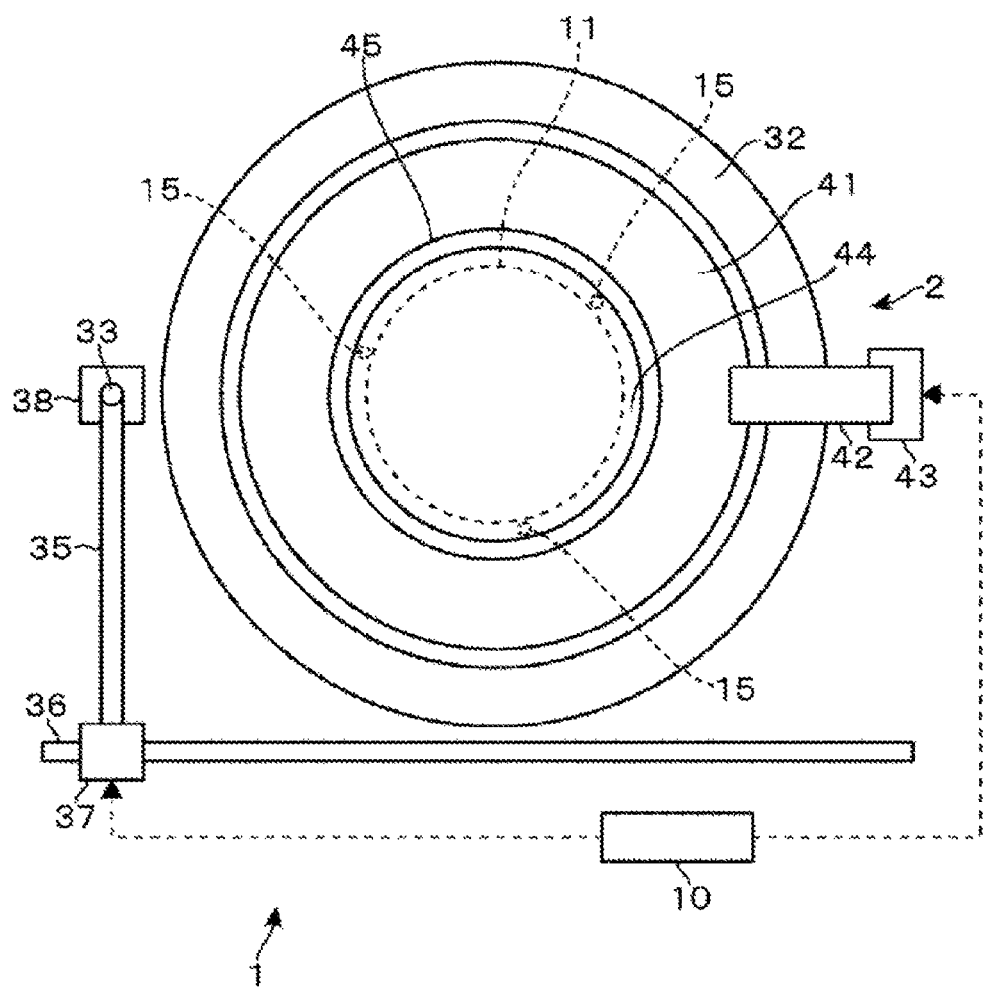
FIG. 2 is a plan view of the resist coating apparatus.

As an embodiment of a coating film forming apparatus according to the present disclosure, a resist coating apparatus 1 for supplying a resist to a wafer W to form a resist film thereon will be described with reference to a longitudinal sectional view of FIG. 1 and a plan view of FIG. 2. The resist coating apparatus 1 has a spin chuck 11 as a substrate holding unit for horizontally holding the wafer W by means of vacuum suction applied to a central portion of a back surface of the wafer W. A lower side of the spin chuck 11 is connected via a shaft 12 to a rotational driving unit 13 which is a rotating mechanism so that the spin chuck 11 may be rotated about a vertical axis by the rotational driving unit 13.

A circular plate 14 is provided below the spin chuck 11 so that the circular plate may surround the shaft 12. Three elevating pins 15 (only two of the elevating pins are shown in FIG. 1) are raised and lowered through holes formed on the circular plate 14. The wafer W can be transferred between a carrying mechanism outside the resist coating apparatus 1 and the spin chuck 11. Reference numeral 17 in FIG. 1 represents a pin elevating mechanism used to raise and lower the elevating pins 15.

A cup body 2 is provided to surround the spin chuck 11. The cup body 2 collects waste liquid scattered or flowing down from a rotating wafer W, and guides the collected waste liquid to be discharged outside the resist coating apparatus 1. The cup body 2 includes a mountain-like guide portion 21 formed in a ring shape around the circular plate 14. The mountain-like guide portion 21 guides the liquid flowing down from the wafer W outward and downward with respect to the wafer W and is formed to have a mountain-like cross section. An annular vertical wall 22 is provided to extend downward from an outer peripheral edge of the mountain-like guide portion 21.

Further, a vertical cylindrical portion 23 is provided to surround the mountain-like guide portion 21, and an upper guide portion 24 is provided to extend inward and upward at an angle from an upper edge of the cylindrical portion 23. A plurality of openings 25 is provided along the circumference of the upper guide portion 24. Further, a lower portion of the cylindrical portion 23 is formed in a concave shape and an annular liquid receiving portion 26 is formed below the mountain-like guide portion 21. A liquid discharging passage 27 is connected to the liquid receiving portion 26, and an exhaust pipe 28 is inserted into the liquid receiving portion 26 from below.

A vertical cylindrical portion 31 is provided to extend upward from a base end of the upper guide portion 24, and a slanting wall 32 is provided to extend inward and upward from an upper edge of the cylindrical portion 31. The liquid scattered from the wafer W due to the rotation of the wafer W is collected with the slanting wall 32, the upper guide portion 24 and the cylindrical portions 23 and 31, and the collected liquid is guided outward and downward with respect to the wafer W and then introduced into the liquid discharging passage 27. A fan filter unit 16 is provided above the cup body 2. While the wafer W is being processed, a clean gas is supplied from the fan filter unit 16 to the cup body 2 positioned, and the cup body 2 is evacuated through the exhaust pipe 28.

A resist nozzle 33 is provided in the resist coating apparatus 1. The resist nozzle 33 is connected to a resist supply source 34. As shown in FIG. 2, the resist nozzle 33 is provided at a leading end of an arm 35. A base end of the arm 35 is connected to a moving mechanism 37 that can raise and lower the arm 35 and move in a horizontal direction along a guide 36. The resist nozzle 33 may be moved by the moving mechanism 37 between a certain position above the wafer W and a standby area 38 positioned outside the cup body 2.

Figure 3:
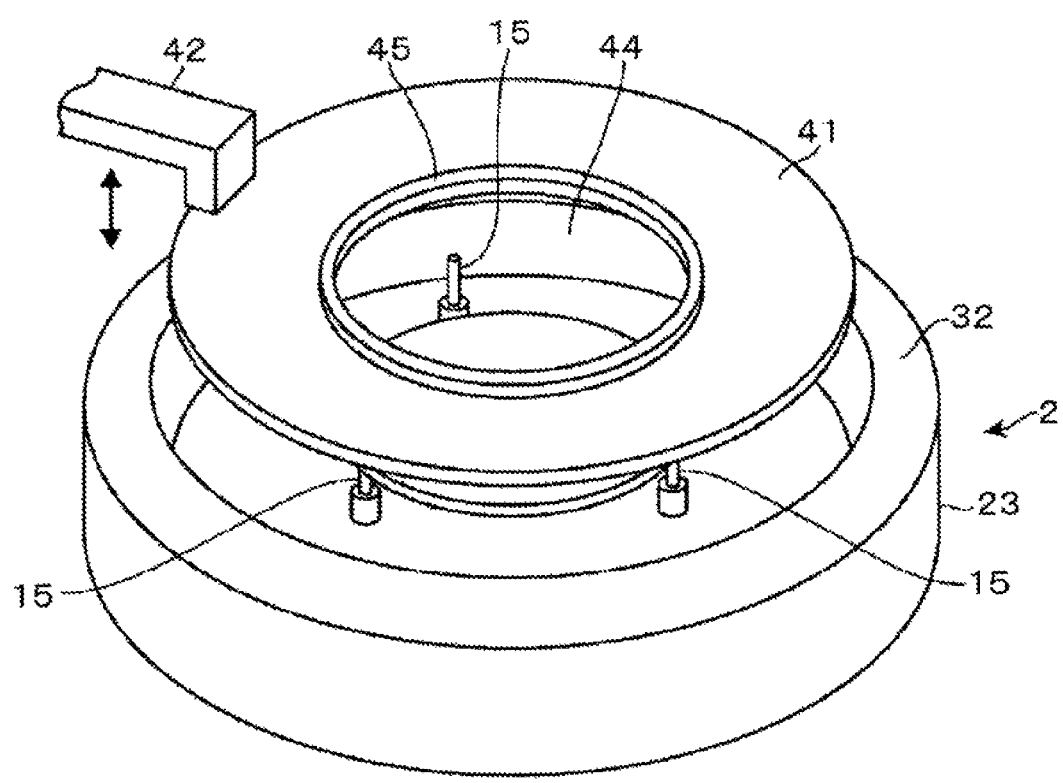
FIG. 3 is a perspective view of the resist coating apparatus.

The resist coating apparatus 1 includes a ring plate 41 as a gas stream rectifying member. FIG. 3 shows a perspective view of the ring plate 41. The ring plate 41 is formed as an annular member that is circular and flat, and formed along a periphery of the wafer W so as to cover the periphery of the wafer W held by the spin chuck 11. The ring plate 41 is horizontally supported by a support member 42. The support member 42 is connected to an elevating member 43 that raises and lowers the ring plate 41 between a raised position represented by a dot-and-dash line and a lowered position represented by a solid line in FIG. 1. When the resist coated on the wafer W is dried, the ring plate 41 is placed at the lowered position. The distance d1 (see FIG. 1) between a bottom surface of the ring plate 41 at the lowered position and a surface of the wafer W ranges from 0.5 mm to 50 mm, for example. When the wafer W is transferred between the carrying mechanism for the wafer W and the spin chuck 11, the ring plate 41 is placed at the raised position so that it does not interfere with the carrying mechanism and the wafer W.

Reference numeral 44 represents an opening provided in the ring plate 41. The opening 44 is formed in a circular shape. When the wafer W is rotated and the periphery of the wafer W is in a negative pressure atmosphere, gas is introduced from above the opening 44 through the opening 44 to the periphery of the wafer W. The introduction of the gas prevents turbulence in the flow of the gas streams near the wafer W due to the formation of the negative pressure atmosphere.

The center of the opening 44 and a center of the ring plate 41 are positioned on a rotational axis of the spin chuck 11. A diameter of the wafer W is 450 mm, for example, and in this case, a diameter of the opening 44 ranges from 150 mm to 300 mm, for example. In the resist coating apparatus 1, the opening 44 has a diameter of 200 mm. A protrusion 45 that protrudes upward is provided along an inner periphery of the ring plate 41. The protrusion 45 is formed in a ring shape along the inner periphery of the ring plate 41 when viewed in a plan view. Further, in this embodiment, the protrusion 45 is formed in a rectangular shape when viewed in a longitudinal sectional view of the ring plate 41. The function of the protrusion 45 will be described in detail later.

A control unit 10 that is a computer is provided in the resist coating apparatus 1. A program stored in a storage medium such as a flexible disk, a compact disk, a hard disk, a magneto-optical (MO) disk and a memory card is installed in the control unit 10. The installed program includes instructions (respective steps) for sending control signals to each of components in the resist coating apparatus 1 to control the operations of the respective components. Specifically, the program controls the operations such as changing the rotational speed of the wafer W by the rotational driving unit 13, moving the resist nozzle 33, supplying/shutting off the resist from the resist supply source 34 to the resist nozzle 33, and rising and lowering the ring plate 41.

Figure 4:
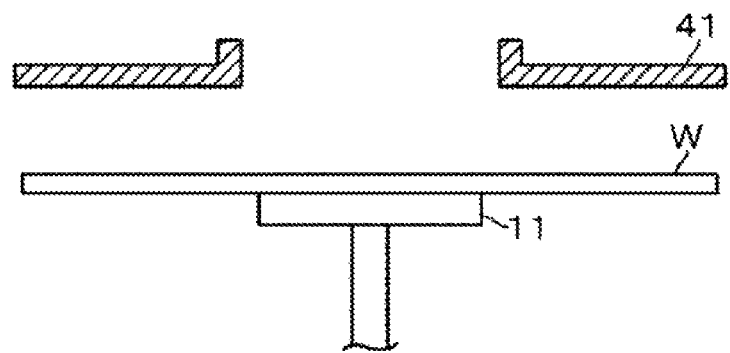
FIG. 4 is a view showing a wafer processing performed by the resist coating apparatus.
Figure 5:
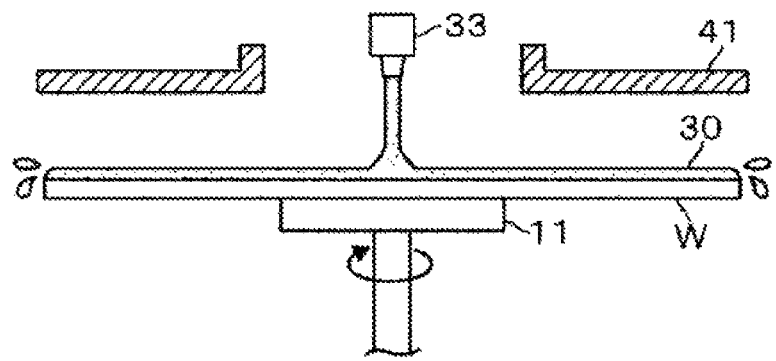
FIG. 5 is a view showing a wafer processing performed by the resist coating apparatus.
Figure 6:
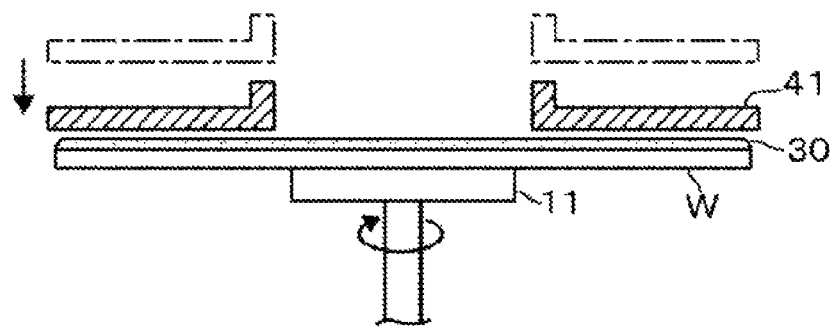
FIG. 6 is a view showing a wafer processing performed by the resist coating apparatus.

Next, processing using the resist coating apparatus 1 described above will be described in detail with reference to the process views of FIGS. 4 to 6. In a state where the ring plate 41 is placed at the raised position, the wafer W is carried to the resist coating apparatus 1 by means of the carrying mechanism (not shown). The wafer W is transferred to the spin chuck 11 by means of the elevating pin 15, and the wafer W is held in such a manner that the central portion of the back surface of the wafer W is attached to the spin chuck 11 by vacuum suction (see FIG. 4). While the wafer W is rotated at 3000 rpm, for example, the resist nozzle 33 moved from the standby area 38 onto the central portion of the wafer W discharges the resist to the central portion of the wafer W. The discharged resist is spread toward the periphery of the wafer W by a centrifugal force to form a resist film 30, and a surplus of the resist is shaken off from the periphery of the wafer W (see FIG. 5). When the resist is discharged and shaken off, the ring plate 41 remains placed at the raised position in order to prevent the resist scattered from the wafer W from being attached to the ring plate 41.

Then, the discharge of the resist is stopped, and the rotational speed of the wafer W is decreased, for example, to 100 rpm, so that the film thickness of the resist film 30 in the plane of the wafer W is adjusted. Then, in order to dry the resist film 30, the rotational speed is increased and the ring plate 41 is moved to the lowered position (see FIG. 6). The rotational speed of the wafer W reaches, e.g., 1500 rpm, and the wafer W continues to be rotated at 1500 rpm. At this time, the resist nozzle 33 is withdrawn to the standby area 38.

Figure 7:
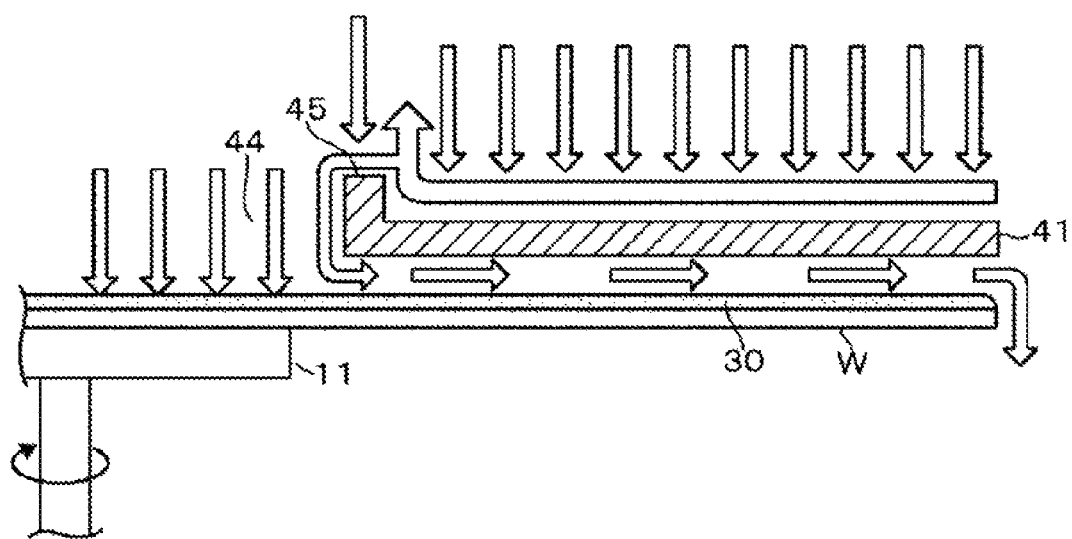
FIG. 7 is a schematic diagram showing gas streams near a ring plate in the resist coating apparatus.

FIG. 7 schematically shows directions of gas streams near the ring plate 41 represented by arrows when the dry process is performed. As described above, the gas is supplied from the fan filter unit 16 toward the wafer W positioned below the fan filter unit 16. Further, since the wafer W is rotated at a high speed, a negative pressure atmosphere is formed near the wafer W. Thus, the gas supplied from the fan filter unit 16 is supplied to the central portion of the surface of the wafer W through the opening 44 of the ring plate 41 to form a gas stream directed toward the periphery of the wafer W. Since the gas is exhausted through the exhaust pipe 28 positioned below the wafer W, the gas stream directed to the periphery of the wafer W flows down from the wafer W and is exhausted by the exhaust pipe 28.

The height of a flow channel for the gas stream directed from the central portion toward the periphery of the wafer W is limited by the bottom surface of the ring plate 41. Therefore, the Reynolds number of the gas stream that passes under the bottom surface of the ring plate 41 is restricted to a small value. Accordingly, the gas stream directed from the central portion toward the periphery of the wafer W flows as a laminar flow rather than as a turbulent flow and then is exhausted through the exhaust pipe 28. Since the resist film 30 is exposed to the laminar flow in such a manner, the resist film 30 below the bottom surface of the ring plate 41 is dried with higher uniformity.

Further, since a negative pressure atmosphere is produced in the surroundings of the wafer W, the gas supplied from the fan filter unit 16 onto the ring plate 41 forms a gas stream that flows on the surface of the ring plate 41 from an outer portion thereof toward the opening 44. This gas stream collides with an outer surface of the protrusion 45 as shown in FIG. 7, so that this gas stream is divided into a gas stream that flows upward along the outer surface of the protrusion 45 and a gas stream that flows over the protrusion 45 and is introduced to a periphery in the opening 44 to be directed toward the wafer W. Then, before the gas stream flowing over the protrusion 45 is supplied to the wafer W, the gas stream is subjected to the centrifugal force of the wafer W and the exhaust operation of the exhaust pipe 28, so that the gas stream is diverted to and then flows toward the periphery of the wafer W. Since the gas stream is dispersed as described above so that the amount of the gas stream to be introduced into the opening 44 is restricted, the introduced gas stream is relatively strongly affected by the centrifugal force and the exhaust operation, and thus diverted to the periphery of the wafer W. That is, the protrusion 45 reduces a component of the gas stream that is directed toward the wafer W positioned just below the ring plate 41 near the inner peripheral edge of the ring plate 41.

Figure 8:
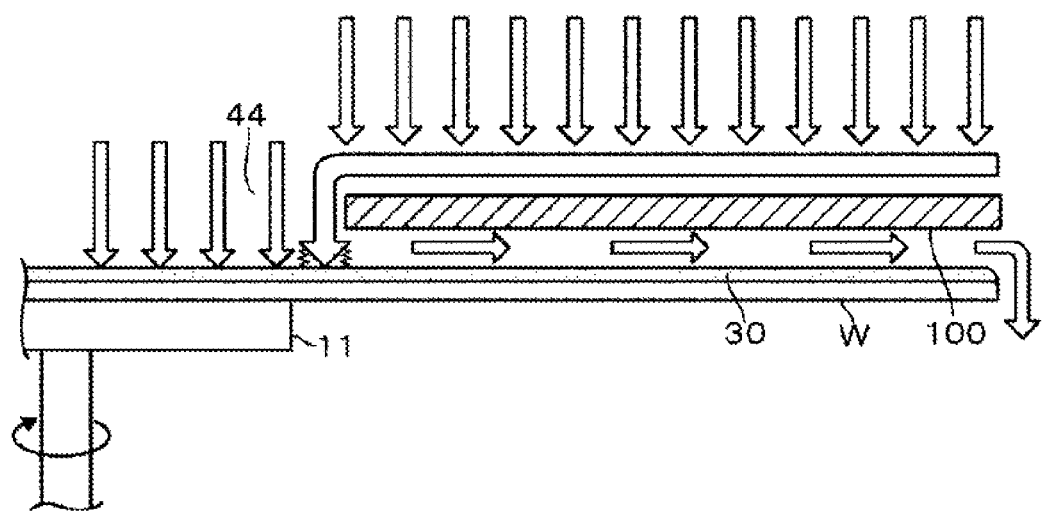
FIG. 8 is a schematic diagram showing gas streams near a ring plate of the resist coating apparatus in a comparative example.

A description will be made with reference to FIG. 8. Similarly to FIG. 7, FIG. 8 schematically shows a gas stream formed around a ring plate 100 when the wafer W is dried using the ring plate 100 instead of the ring plate 41. The ring plate 100 is a comparative example for the ring plate 41 and is configured to be similar to the ring plate 41 except that no protrusion 45 is provided.

When the ring plate 100 is used, a gas stream flowing on the ring plate 100 from an outer portion thereof toward the opening 44 is introduced downward from the periphery of the opening 44 without being dispersed by the protrusion 45. That is, since a greater amount of the gas stream is introduced into the opening 44 as compared with the case of using the ring plate 41, the introduced gas stream is not diverted to the periphery of the wafer W until the introduced gas stream reaches the wafer W even if the introduced gas stream is subjected to the centrifugal force and the exhaust operation. Thus, the introduced gas stream collides with the wafer W, and then flows toward the periphery of the wafer W. That is, the gas stream with a large amount of the component flowing directly downward acts on the surface of the wafer W near the inner peripheral edge of the ring plate 41. If the gas stream includes a large amount of the component flowing directly downward, a drying effect on the resist film 30 is increased. This causes the resist film 30 near the inner peripheral edge of the ring plate 100 to be dried easily. As a result, the resist film 30 near the inner peripheral edge of the ring plate 100 has a relatively large film thickness after the dry process is terminated, as shown in evaluation tests to be described later.

Referring back to FIG. 7, when the ring plate 41 is used, the component of the gas stream flowing directly downward near the inner peripheral edge of the ring plate 41 is reduced, as described above. This restrains drying conditions near the inner peripheral edge of the ring plate 41 from being different from those at other locations. Further, since an occurrence of the turbulent flow is prevented at the periphery of the wafer W as described above, the entire surface of the wafer W is exposed to the laminar flow. Therefore, the resist film may be dried with higher uniformity in the plane of the wafer W. When a predetermined amount of time elapses after the discharge of the resist is terminated, the rotation of the wafer W is stopped. Then, the ring plate 41 is moved to the raised position, and the wafer W is transferred from the spin chuck 11 to the carrying mechanism (not shown). Then, the wafer W is carried outside the resist coating apparatus 1.

In the resist coating apparatus 1, the ring plate 41 is provided above and along the periphery of the wafer W. Further, the protrusion 45 that protrudes upward is formed along the inner periphery of the ring plate 41. By configuring the resist coating apparatus 1 as described above, the gas stream at the periphery of the wafer W is rectified to be restrained from becoming a turbulent flow, even if the wafer W is rotated at a relatively high rotational speed in order to dry the resist film. Because the gas stream that has the component flowing directly downward is restrained from being concentrated near the inner peripheral edge of the ring plate 41 during the rotation of the wafer W, it is possible to prevent the film thickness of the resist film near the inner peripheral edge of the ring plate 41 from being locally increased in the plane of the wafer W. Accordingly, the time required for the dry process can be restrained to improve the throughput and the in-plane uniformity of the film thickness of the resist film can be prevented from being deteriorated.

Figure 9:
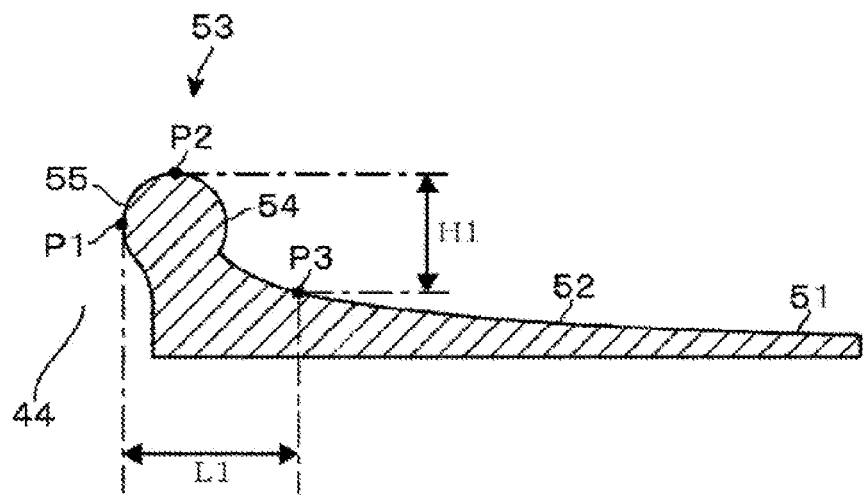
FIG. 9 is a longitudinal sectional view showing a configuration of another ring plate.

Another example of the ring plate will be described. A ring plate 51 shown in FIG. 9 is different from the ring plate 41 in view of their longitudinal sectional shapes. For the sake of illustration, an upper surface of the ring plate 51 is represented by reference numeral 52. A height of the upper surface 52 is gradually increased with respect to a horizontal surface when measured from an outer periphery toward the inner periphery of the ring plate 51.

Figure 10:
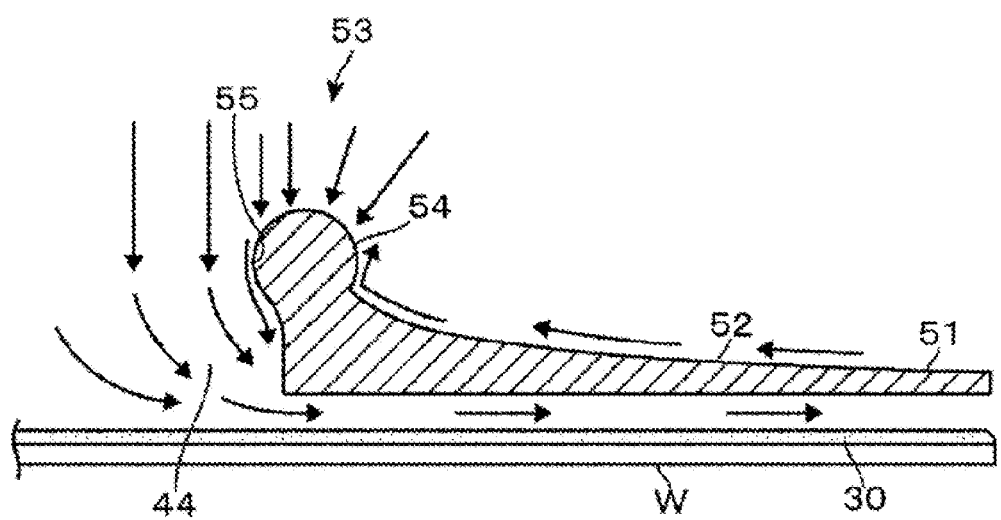
FIG. 10 is a schematic diagram showing gas streams near the ring plate of FIG. 9.

The reason for the configuration of the upper surface 52 as described above will be described with reference to FIG. 10. In FIG. 10, gas streams produced around the ring plate 51 when the dry process is performed using the ring plate 51 instead of the ring plate 41 are represented by arrows. During the dry process of the resist film as described above, a gas stream directed from the outer periphery toward the inner periphery (toward a protrusion 53) of the ring plate 51 is produced. By forming the upper surface 52 as described above, the gas stream is guided upward. Thus, it is possible to more firmly restrain the gas stream from being introduced into the opening 44. Accordingly, the component of the gas stream flowing directly downward to the wafer W can be further decreased near the inner peripheral edge of the ring plate 51, thereby enhancing the uniformity in the film thickness. Although the upper surface 52 is configured to take the shape of a curved line when viewed in the longitudinal cross section of the ring plate 51, the upper surface 52 may be configured to take the shape of a straight line. If the upper surface 52 is configured to take the shape of the straight line as described above, the ring plate 51 may be configured to take the shape of the straight line from the outer periphery to the protrusion of the ring plate 51. Alternatively, the ring plate 51 may be configured to take the shape of a bent line when viewed in the longitudinal cross section of the ring plate 51.

The ring plate 51 is provided with the protrusion 53 instead of the protrusion 45. The protrusion 53 is roughly formed in a circular shape when viewed in the longitudinal cross section. Hereinafter, for the sake of illustration, outer and inner surfaces of the protrusion 53 will be represented by reference numerals 54 and 55, respectively. Since the longitudinal cross section of the protrusion 53 is formed in the circular shape as described above, the outer surface 54 of the protrusion 53 is configured to have a slanted surface that descends toward an inner side (central side) of the ring plate 51. Further, assuming that an end portion of the upper surface 52 close to the opening 44 also constitutes the protrusion 53, the outer surface 54 of the protrusion 53 has an inwardly recessed portion that forms the slanted surface.

With the slanted surface that descends toward the inner side of the ring plate 51, the gas stream flowing from the outer periphery toward the protrusion 53 of the ring plate 51 is guided to flow back toward the outer periphery (see FIG. 10). This can ensure to restrict the amount of the gas stream to be introduced into the opening 44. In order to cause the gas stream to flow back as described above, the slanted surface may be configured to be a planar surface instead of a curved surface. Further, similar to the outer surface of the protrusion 45 shown in FIG. 1, the outer surface 54 may be configured to have a vertical surface. Since the vertical surface may also guide the gas stream upward, the vertical surface may restrain the gas stream from being introduced into the opening 44 similar to the case where the slanted surface is provided.

Since the protrusion 53 is roughly formed in the circular shape when viewed in the longitudinal cross section as described above, the inner surface 55 is configured to protrude toward the inner side of the ring plate 51 and a lower portion of the inner surface 55 constitutes an outwardly-descending slanted surface descending toward an outer side of the ring plate 51. The slanted surface causes the gas stream that has been introduced into the opening 44 to be guided toward the periphery of the wafer W. Accordingly, it is possible to more ensure to prevent a strong effect of the gas stream flowing directly downward onto the resist film. Although the slanted surface of the inner surface 55 is a curved surface in this embodiment, it may be a planar surface.

In some embodiments, the protrusion provided in the ring plate 51 may protrude steeply from the inner periphery of the ring plate 51 in order to block the gas stream flowing from an outer portion to an inner portion of the ring plate 51. The steep protruding of the protrusion 53 will be specifically described with reference to FIG. 9. In FIG. 9, P1 is a point on the inner peripheral edge of the ring plate 51 (in this embodiment, an inner peripheral edge of the protrusion 53) and L1 is an area ranging from the point P1 to a point that is 30 mm distant from the point P1 toward the outer side of the ring plate 51. The protrusion is considered to be steep when a difference H1 between a height of a peak position P2 in the area L1 and a height of a lowest position P3 in a region outside the peak position P2 in the area L1 is 30 mm or more.

Figure 11:
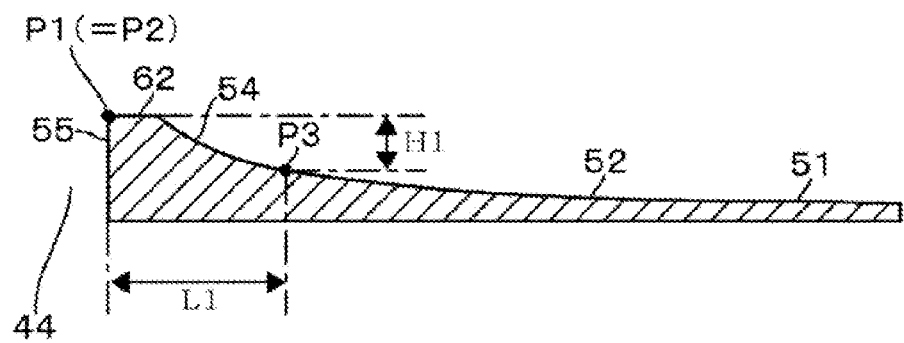
FIG. 11 is a longitudinal sectional side view showing a configuration of another ring plate.

FIG. 11 shows a ring plate 61. The ring plate 61 has a protrusion 62, and an upper surface 52 of the ring plate 61 and an outer surface 54 of the protrusion 62 are defined by a continuous curved surface. An inner surface of the protrusion 62 is defined by a vertical surface while a peak portion of the protrusion 62 is defined by a horizontal surface. Unlike the ring plate 51, the difference H1 in the ring plate 61 is less than 30 mm. That is, the protrusion 62 is not steep.

Figure 12:
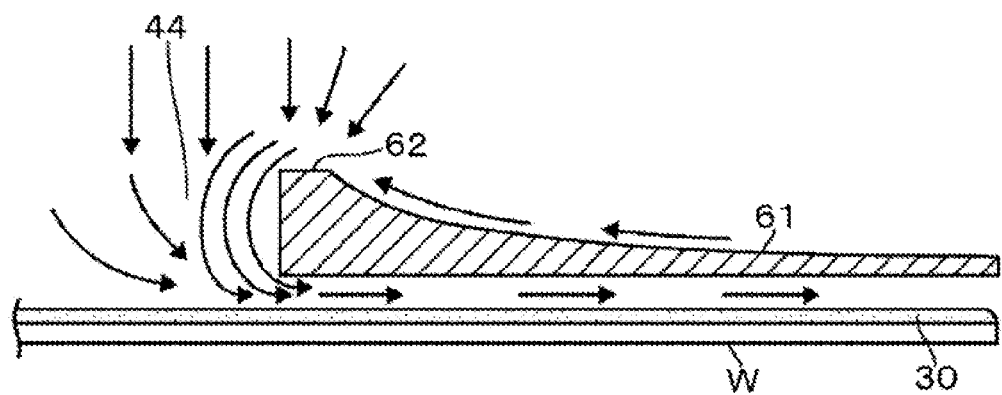
FIG. 12 is a schematic diagram of gas streams near the ring plate of FIG. 11.

In FIG. 12, gas streams produced around the ring plate 61 during the dry process of the wafer W are represented by arrows. With the protrusion 62 provided as described above, the ring plate 61 may ensure to restrain a gas stream from being introduced into the opening 44, as compared with the ring plate 100 described above. However, in the case where the ring plate 51 is used instead of the ring plate 61, the protrusion 53 may ensure to restrain a gas stream, which horizontally flows from the outer periphery of the ring plate toward the opening 44, from being introduced into the opening 44, resulting in higher uniformity in the film thickness.

Figure 13:
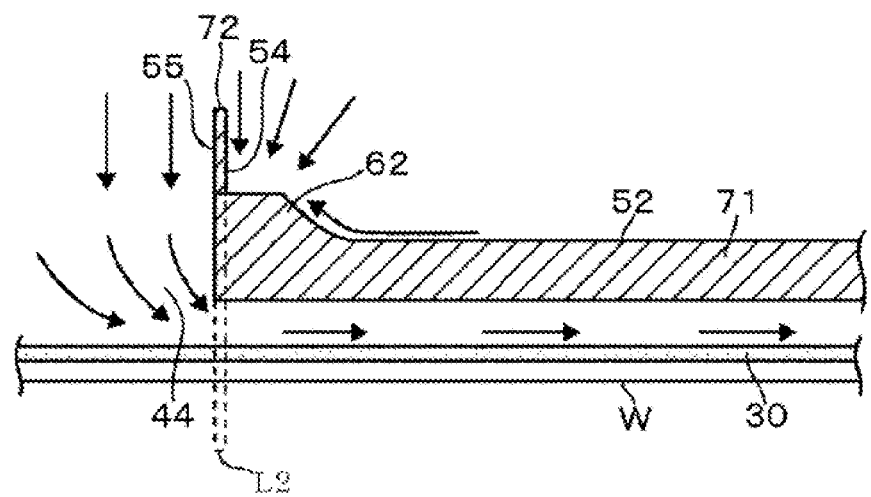
FIG. 13 is a longitudinal sectional view showing a configuration of another ring plate.

FIG. 13 shows an example of the configuration of another ring plate. A ring plate 71 shown in FIG. 13 is configured to be generally similar to the ring plate 61 illustrated in FIG. 12 except that an inner periphery of the protrusion 62 further protrudes upward to form a ring-shaped protrusion 72 of which the cross section has a small width. Inner and outer surfaces 55 and 54 of the protrusion 72 are formed to be vertical. In FIG. 13, gas streams produced during the dry process of the resist film are represented by arrows, like FIGS. 10 and 12. The width L2 of the protrusion 72 shown in FIG. 13 ranges, e.g., from 0.01 mm to 20 mm.

Figure 14:
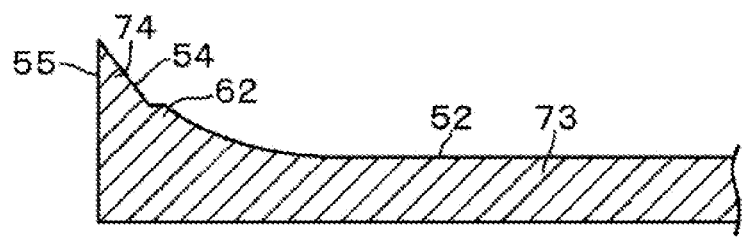
FIG. 14 is a longitudinal sectional view showing a configuration of another ring plate.
Figure 15:
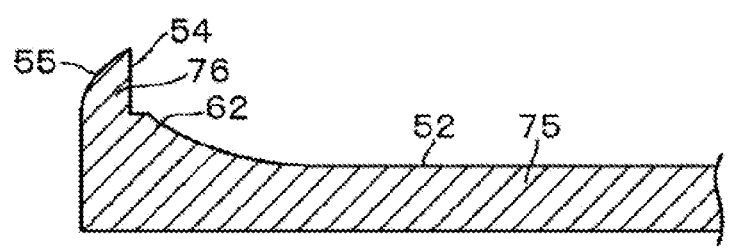
FIG. 15 is a longitudinal sectional view showing a configuration of another ring plate.

A ring plate 73 shown in FIG. 14 is configured to be similar to the ring plate 71 shown in FIG. 13 except for the shape of a protrusion 74 provided instead of the protrusion 72. The protrusion 74 is configured to take the shape of a triangle in its cross section, in which an outer surface 54 of the protrusion 74 is defined by an outwardly-descending slanted surface while an inner surface 55 of the protrusion 74 is configured to be vertical. A ring plate 75 shown in FIG. 15 is also configured to be similar to the ring plate 71 shown in FIG. 13 except for the shape of a protrusion 76 provided in the ring plate 75. The protrusion 76 is configured to take the shape of a fan in its cross section, in which an outer surface 54 of the protrusion 76 is defined by a vertical surface while an inner surface 55 of the protrusion 76 is defined by a curved surface. Since the outer surface 54 is vertical as described above, it is possible to prevent the introduction of the gas stream into the opening 44 noticeably.

Figure 16:
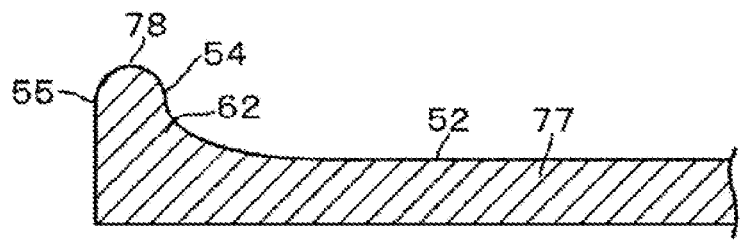
FIG. 16 is a longitudinal sectional view showing a configuration of another ring plate.

A ring plate 77 shown in FIG. 16 includes a protrusion 78 taking the shape of a semicircle in its cross section provided on the protrusion 62, in which an upper surface 52 of the ring plate 77 and outer and inner surfaces 54 and 55 of the protrusion 78 are defined by a continuous curved surface. A ring plate 81 shown in FIG. 17 includes a protrusion 82 taking the shape of a triangle in its cross section. An inner peripheral edge of an upper surface 52 of the ring plate 81 is vertically drawn to define an outer surface 54 of the protrusion 82 while an inner surface 55 of the protrusion 82 is defined by an inwardly-descending slanted surface descending toward an inner side of the ring plate 81. In some embodiments, the inner surface 55 have an outwardly-descending slanted surface which descends to an outer portion of the ring plate 77, as described in FIGS. 9 and 10.

Figure 18:
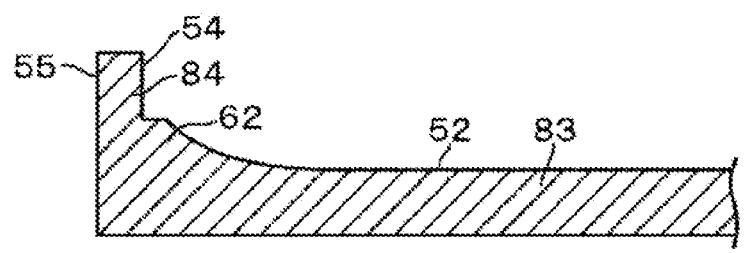
FIG. 18 is a longitudinal sectional view showing a configuration of another ring plate.

A ring plate 83 shown in FIG. 18 has a protrusion 84 and is configured to be generally similar to the ring plate 71 shown in FIG. 13, except that the thickness of the protrusion 84 in a diametric direction of the ring plate 83 is larger than that of the protrusion 72 of the ring plate 71. A ring plate 85 shown in FIG. 19 has a protrusion 86. A difference between the protrusion 86 and the protrusion 84 shown in FIG. 18 is that an outer surface 54 of the protrusion 86 is defined by an inwardly-descending slanted surface which descends to an inner side of ring plate 85. Similar to the ring plate 51 as described in FIG. 10, the gas stream flowing toward the opening 44 may be guided to flow back toward an outer periphery of the ring plate 85.

Figure 19:
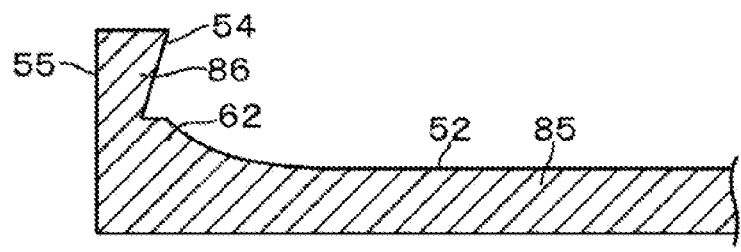
FIG. 19 is a longitudinal sectional view showing a configuration of another ring plate.

In some embodiments, the peak portion of the protrusion may be configured to have a short length rather than a long length in the diametric direction of the ring plate as illustrated in the protrusions 84 and 86 shown in FIGS. 18 and 19. That is, the protrusion may be formed in a rectangular shape having a small width when viewed in a cross section like the protrusion 72 shown in FIG. 13. The protrusion may be formed in a tapered shape when viewed in a cross section like the protrusions 74, 76, 78 and 82 shown in FIGS. 14 to 17. If the length of the peak portion in the diametric direction of the ring plate is large, the amount of the gas stream controlled by the protrusion is decreased, thus causing the gas stream supplied to the peak portion to be introduced into the opening 44 without being blocked by the protrusion.

Figure 20:
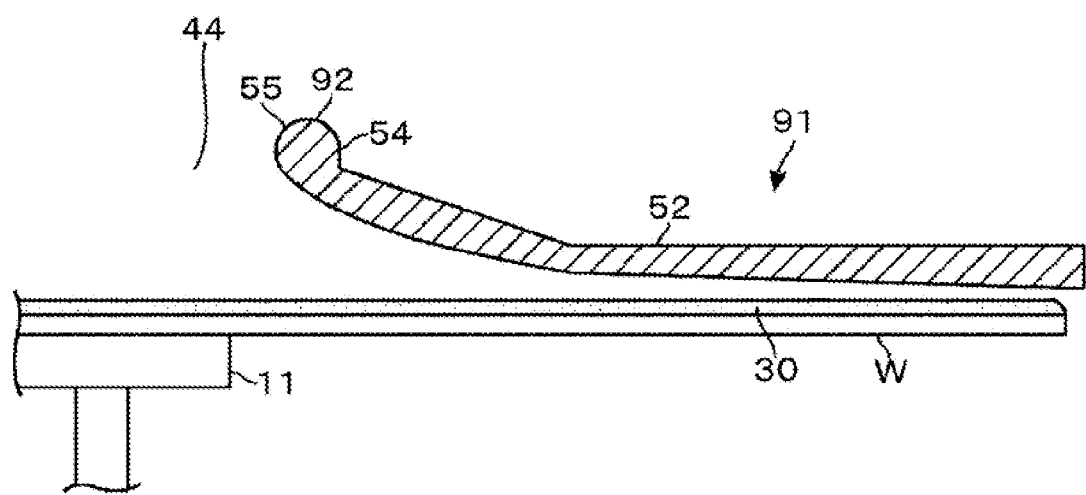
FIG. 20 is a longitudinal sectional view showing a configuration of another ring plate.

FIG. 20 shows an example of a configuration of another ring plate. When a ring plate 91 is viewed in a longitudinal cross section as for a bottom surface of the ring plate 91, a portion of the bottom surface on an outer periphery of the ring plate 91 is configured to take the shape of a straight line while a portion of the bottom surface on an inner periphery of the ring plate 91 is configure to take the shape of a curved line. Further, a distance between the bottom surface of the ring plate 91 and the surface of the wafer W becomes gradually smaller toward the outer periphery of the ring plate. Thus, a flow channel of the gas stream becomes small at the periphery of the wafer W, thereby more surely preventing the turbulence in the gas stream. Further, since the distance between the bottom surface of the ring plate 91 and the wafer W is large at the central portion of the wafer W, the gas stream which is introduced into the opening 44 and flows downward may be easily diverted to the periphery of the wafer W by the centrifugal force and the exhaust operation described above before the gas stream reaches the wafer W. Accordingly, the application of the component of the gas stream flowing directly downward to the wafer W can be surely prevented.

Further, the ring plate 91 has a protrusion 92. The protrusion 92 is configured to generally take the shape of a circle in a cross section. An inner surface 55 of the protrusion 92, an inner surface of the ring plate 91 below the protrusion, and a bottom surface of the ring plate 91 are defined by a continuous curved surface, and thus, no corner is formed from the inner surface 55 of the protrusion 92 to the bottom surface of the ring plate 91. This avoids an occurrence of turbulence in the gas stream due to the corner. An outer surface 54 of the protrusion 92 has a vertical surface.

Figure 21:
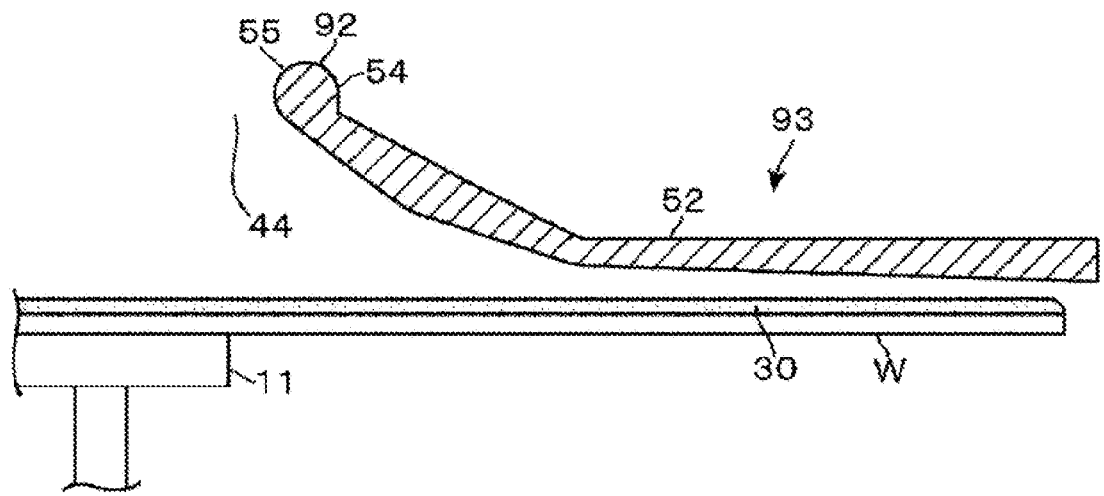
FIG. 21 is a longitudinal sectional view showing a configuration of another ring plate.

FIG. 21 shows another ring plate 93. The ring plate 93 is configured to be similar to the ring plate 91 except that the shape of a bottom surface of the ring plate 93 is different from that of the ring plate 91. The bottom surface of the ring plate 93 is configured to take the shape of a broken line that is bent at a plurality of positions spaced apart from one another in the diametric direction of the ring plate when viewed in a cross section. As shown in the examples of FIGS. 20 and 21, the bottom surface of the ring plate is bent or curved at one or more positions when viewed in the diametric direction of the ring plate. Thus, the distance between the surface of the wafer W and the bottom surface becomes gradually smaller toward the periphery of the wafer W.

Figure 22:
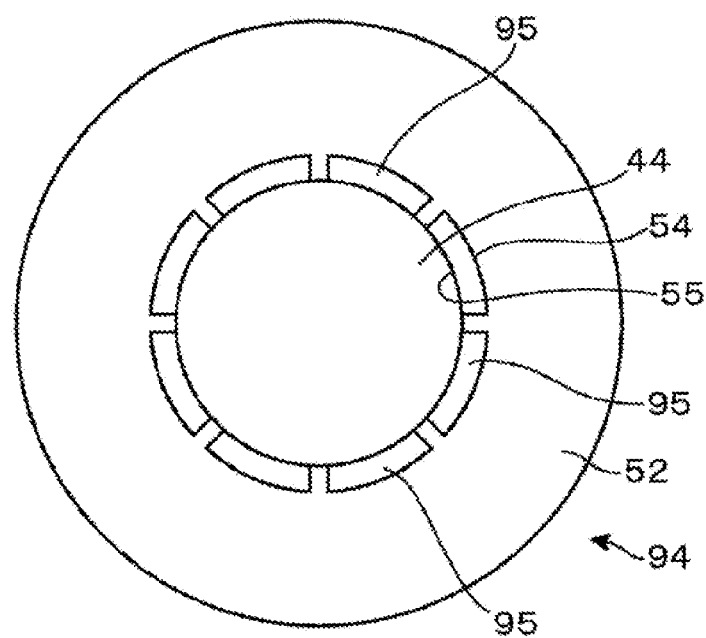
FIG. 22 is a plan view showing a configuration of another ring plate.

Although the protrusions in the respective aforementioned examples are formed in the shape of a ring when viewed in a plan view, they are not limited to such a configuration, but the protrusions may be formed along the inner peripheries of the ring plate. FIG. 22 is a plan view of a ring plate 94. For example, a protrusion 95 shown in FIG. 22 is configured to be generally similar to, e.g., the protrusion 45 shown in FIGS. 1 and 2. However, the protrusions 95 is not formed in a unitary ring shape, but formed with a plurality of parts spaced apart from one another in a circumferential direction of the ring plate 94 as shown in FIG. 22.

Figure 17:
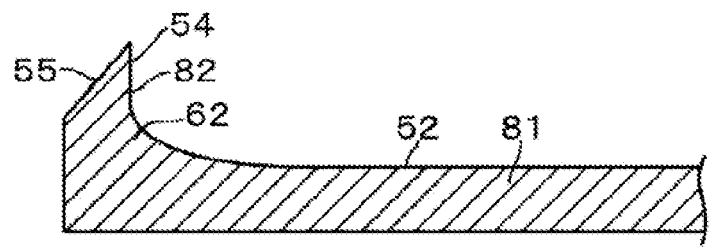
FIG. 17 is a longitudinal sectional view showing a configuration of another ring plate.
Figure 23:
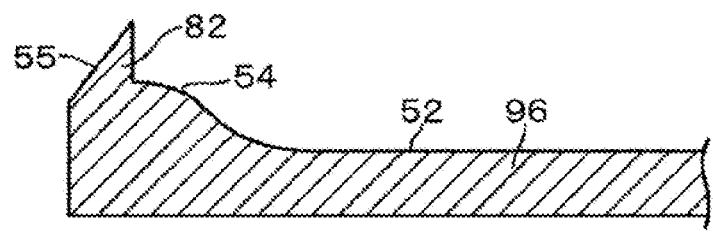
FIG. 23 is a longitudinal sectional view showing a configuration of another ring plate.

However, in the ring plate 81 shown in FIG. 17, the outer surface 54 of the protrusion 82 which faces the outer side of the ring plate 81 includes a vertical surface and an outwardly-descending slanted surface that continues from the vertical surface and descends toward an outer side of the ring plate 81. The outwardly-descending slanted surface continues to the upper surface 52 of the ring plate 81. The outwardly-descending slanted surface is a curved surface and is configured to define an arc protruding downward and toward the inner side of the ring plate 81 when viewed in a cross section, but is not limited thereto. A ring plate 96 shown in FIG. 23 is different from the ring plate 81 in view of the slanted surface. The slanted surface in the ring plate 96 is defined by a curved surface, but the slanted surface is configured to define an arc protruding upward and toward an outer side of the ring plate 96 when viewed in a cross section. Further, the outwardly-descending slanted surface in the outer surface 54 is not limited to a curved surface as in the ring plates 81 and 96, but may be a planar surface.

Figure 24:
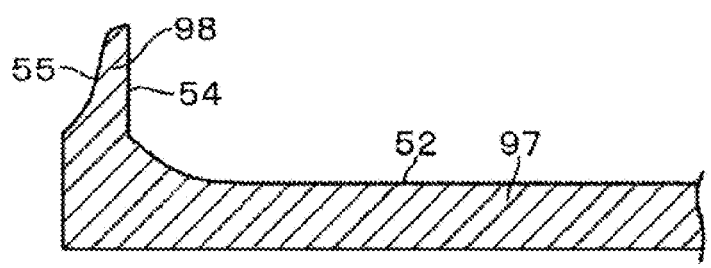
FIG. 24 is a longitudinal sectional view showing a configuration of another ring plate.

Further, in the ring plate 51 shown in FIG. 9, the inner surface 55 that faces the central portion of the ring plate 51 is configured to have an inwardly-descending slanted surface that descends toward the inner side of the ring plate 51. The slanted surface is configured to define an arc protruding upward and toward the central portion of the ring plate 51 when viewed in a cross section, but is not limited thereto. A ring plate 97 shown in FIG. 24 has a protrusion 98. An inner surface 55 of the protrusion 98 has a slanted surface that is a curved surface configured to descend toward the inner side of the ring plate 97 similar to the inner surface 55 of the ring plate 51. However, the slanted surface is configured to define an arc protruding downward and toward an outer side of the ring plate 97 when viewed in a cross section. Further, the inwardly-descending slanted surface in the inner surface 55 as described above may be a planar surface.

The timing when the ring plate 41 is moved to the lowered position described above is not limited to that of the aforementioned example. Alternatively, the ring plate 41 may be moved to the lowered position when the resist is discharged. Further, the spin chuck 11 may be configured to be raised and lowered so that the distance between the wafer W and the bottom surface of the ring plate 41 may be changed between when the resist is discharged onto the wafer W and when the resist on the wafer W is dried.

Although the present disclosure has been described in connection with the case where the resist is used as a coating liquid, the present disclosure may also be applied to a case where liquid chemical for forming an antireflective film or liquid chemical for forming an insulating film is coated on a substrate. Further, the substrate is not limited to a circular substrate, but may be a rectangular substrate. The opening 44 may also be formed in a rectangular shape. In this case, a protrusion is formed along the rectangular opening 44. Further, the respective configurations of the ring plates described above may be combined with one another.

In some embodiments, the respective protrusions described above may be configured so as to achieve a film thickness distribution of 2% or less in a region between an inner position which is 35 mm inward and an outer position which is 35 mm outward from the position on the wafer just below the inner peripheral edge of the ring plate in the diametric direction of the ring plate. The film thickness distribution is defined as {(a maximum value of the film thickness measured in the region—a minimum value of the film thickness in the region)/an average value of the film thickness measured in the region}×100.

<Evaluation Tests>

Evaluation Test 1

Resist films were formed on a plurality of wafers W using an apparatus that is similar to the resist coating apparatus 1 described above. However, the ring plate as described above was not provided in the resist coating apparatus used in this Evaluation Test 1. As the wafer W, the wafer having a diameter of 300 mm (hereinafter, referred as a 300 mm wafer W) and a wafer having a diameter of 450 mm (hereinafter, referred as a 450 mm wafers W) were used, and the time required to dry the resist film (referred to as film drying time) was investigated while changing the rotational speed of the respective wafers in the dry process for respective wafers. Further, for each of the 300 mm wafer W and the 450 mm wafer W, 3-sigma values of film thicknesses measured at a plurality of positions in the plane of the wafer W were investigated.

Figure 25:
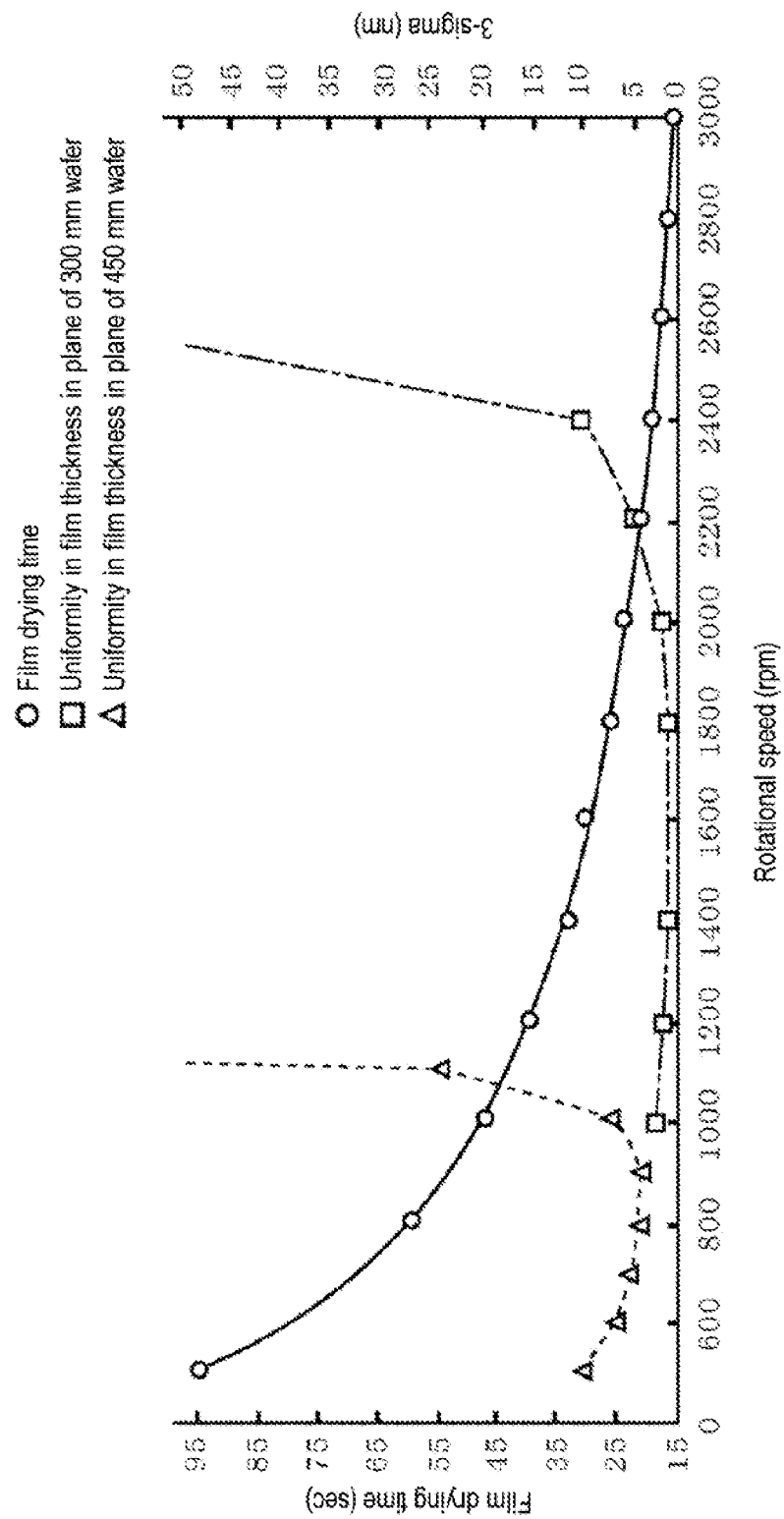
FIG. 25 is a graph representing a result of an evaluation test.

Results of Evaluation Test 1 are shown in a graph illustrated in FIG. 25. Vertical axes of the graph represent the film drying time and the 3-sigma value, and a horizontal axis of the graph represents the rotational speed of the wafer W in the dry process. As shown in this graph, the film drying time may be shortened as the rotational speed of the wafer W increases in the dry process. As can be seen from the graph, the 3 sigma value of the 450 mm wafer W is high (i.e., an in-plane uniformity is low) even when the rotational speed is small, as compared with the 300 mm wafer W. From the result, it is believed that the respective ring plates described in the aforementioned embodiments need to be provided above the wafer W to reduce the flow channel for the gas flowing above the periphery of the wafer W, effectively restricting an increase in the Reynolds number of the gas to prevent the occurrence of the turbulent flow.

Evaluation Test 2

Similar to Evaluation Test 1, resist films in Evaluation Test 2 were formed on a plurality of wafers W while changing the rotational speed of the wafer in the dry process. As for the wafers S, the film thicknesses were measured at a plurality of positions to calculate the 3-sigma values. Similar to Evaluation Test 1, the 300 mm wafer W and the 450 mm wafer W were used. Similar to Evaluation Test 1, the 300 mm wafer W was processed by the resist coating apparatus with no ring plate provided therein. The test performed using the 300 mm wafer W is referred to as Evaluation Test 2-1. The 450 mm wafer W was tested using a resist coating apparatus with the ring plate provided therein and using the resist coating apparatus with no ring plate provided therein, respectively. The test performed on the 450 mm wafer W using the resist coating apparatus 1 with no ring plate provided therein is referred to as Evaluation Test 2-2, and the test performed on the 450 mm wafer W using the resist coating apparatus 1 with the ring plate provided therein is referred to as Evaluation Test 2-3.

Figure 26:
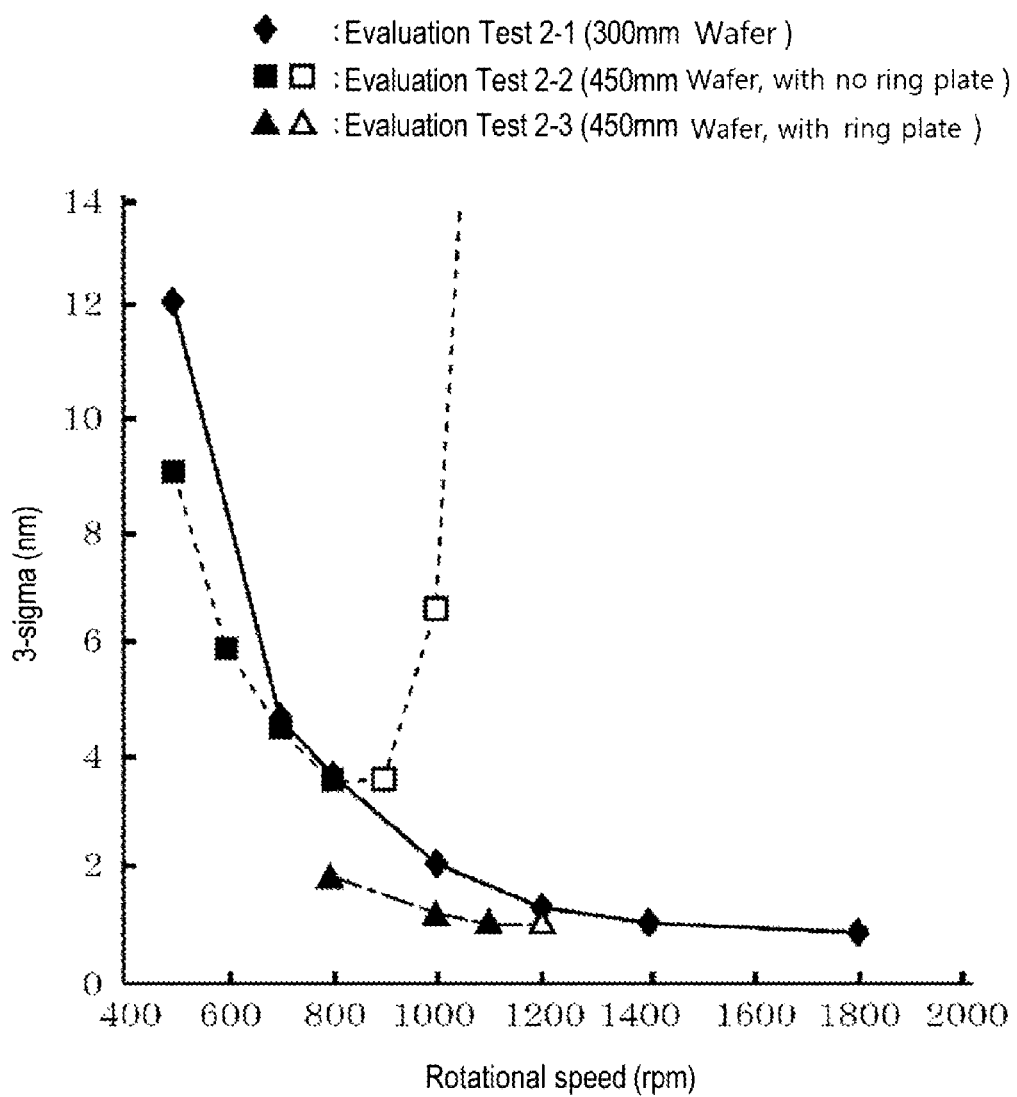
FIG. 26 is a graph representing a result of an evaluation test.

FIG. 26 is a graph showing results of this Evaluation Test 2. A vertical axis of the graph represents the 3-sigma value of the film thickness and a horizontal axis of the graph represents the rotational speed of the wafer W in the dry process. The test results of Evaluation Tests 2-2 and 2-3 are represented by black-outlined white plots and non-outlined black plots. The black-outlined white plots represent that marks referred as wind-cut marks that may be caused by a transcription of the gas stream were found on a resist film at the periphery of the wafer W. These wind-cut marks are stripe-patterned marks directed from the central portion to the periphery of the wafer W. The non-outlined black plots represent that no wind-cut mark was found.

When the rotational speed of the wafer in the dry process ranges from 500 rpm to 800 rpm, the 3 sigma values in Evaluation Tests 2-1 is approximately identical to that in Evaluation Test 2-2. When the rotational speed was 900 rpm or more, however, the 3 sigma values in Evaluation Test 2-2 became larger than those in Evaluation Test 2-1. Further, when the rotational speed of the wafer in the dry process was 900 rpm or more, the wind-cut marks were found in Evaluation Test 2-2. In Evaluation Test 2-1, when the rotational speed of the wafer in the dry process ranges from 500 rpm to 1800 rpm, no wind-cut mark was found. Further, when the rotational speed of the wafer ranges from 800 rpm to 1200 rpm, the 3 sigma values in Evaluation Test 2-3 were smaller than those in Evaluation Tests 2-1 and 2-2. In addition, when the rotational speed of the wafer ranges 800 rpm to 1100 rpm in Evaluation Test 2-3, no wind-cut mark was found.

Figure 27:
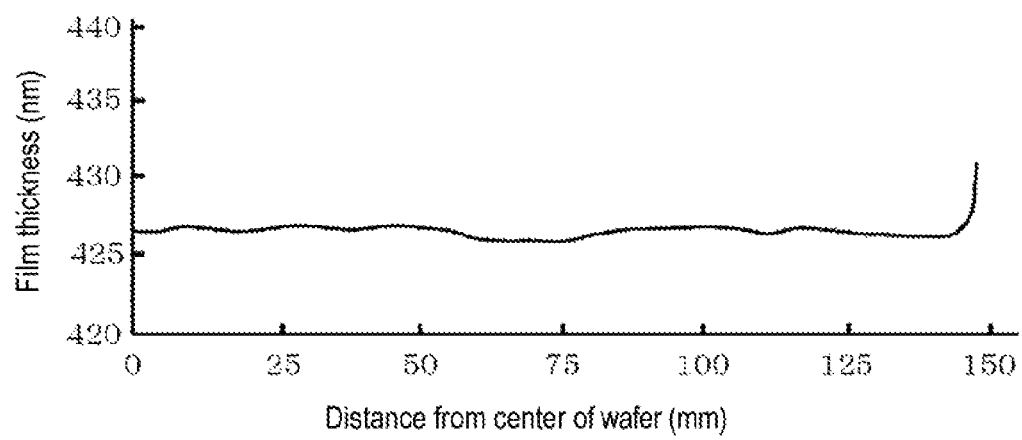
FIG. 27 is a graph representing a result of an evaluation test.
Figure 28:
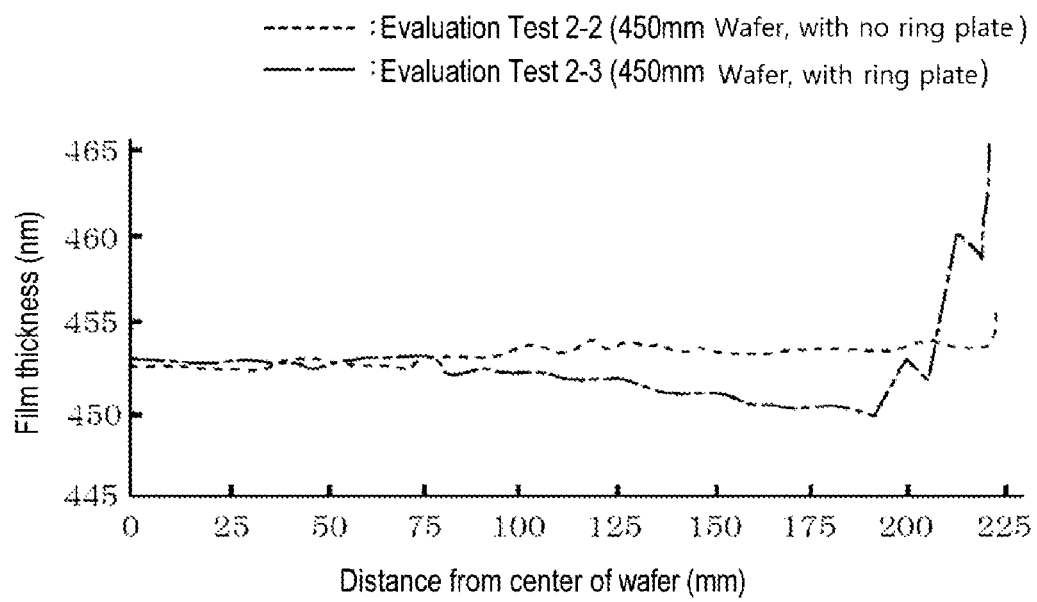
FIG. 28 is a graph representing a result of an evaluation test.

A film thickness distribution in the diametric direction of the wafer W in Evaluation Test 2-1 when the rotational speed of the wafer in the dry process was 1200 rpm is shown in a graph of FIG. 27. Film thickness distributions in the diametric directions of the wafers W in Evaluation Tests 2-2 and 2-3 when the rotational speed of the wafer in the dry process was 1100 rpm are shown in a graph of FIG. 28. That is, the graph of FIG. 28 illustrates the film thickness distribution of the wafer W in which wind-cut marks were found in Evaluation Test 2-2 and the film thickness distribution of the wafer W in which no wind-cut mark was found in Evaluation Test 2-3. The horizontal axis of the graph shown in each of FIGS. 27 and 28 represents a distance from the center of the wafer W and the vertical axis represents the film thickness of the resist film measured. As shown in these graphs, a deviation in the film thicknesses at each position on the wafer W in Evaluation Test 2-3 is prevented as much as in Evaluation Test 2-1. In particular, the deviation in the film thickness at the periphery of the wafer W is further restricted in Evaluation Test 2-3, as compared with the wafer W in Evaluation Test 2-2.

From the results of this Evaluation Test 2, even if a wafer W having a relatively large diameter is used and the rotational speed of the wafer W in the dry process is increased, the occurrence of the wind-cut marks at the periphery of the wafer W is prevented, thereby restricting the deviation in film thickness in the plane of the wafer W.

Evaluation Test 3

Figure 29:
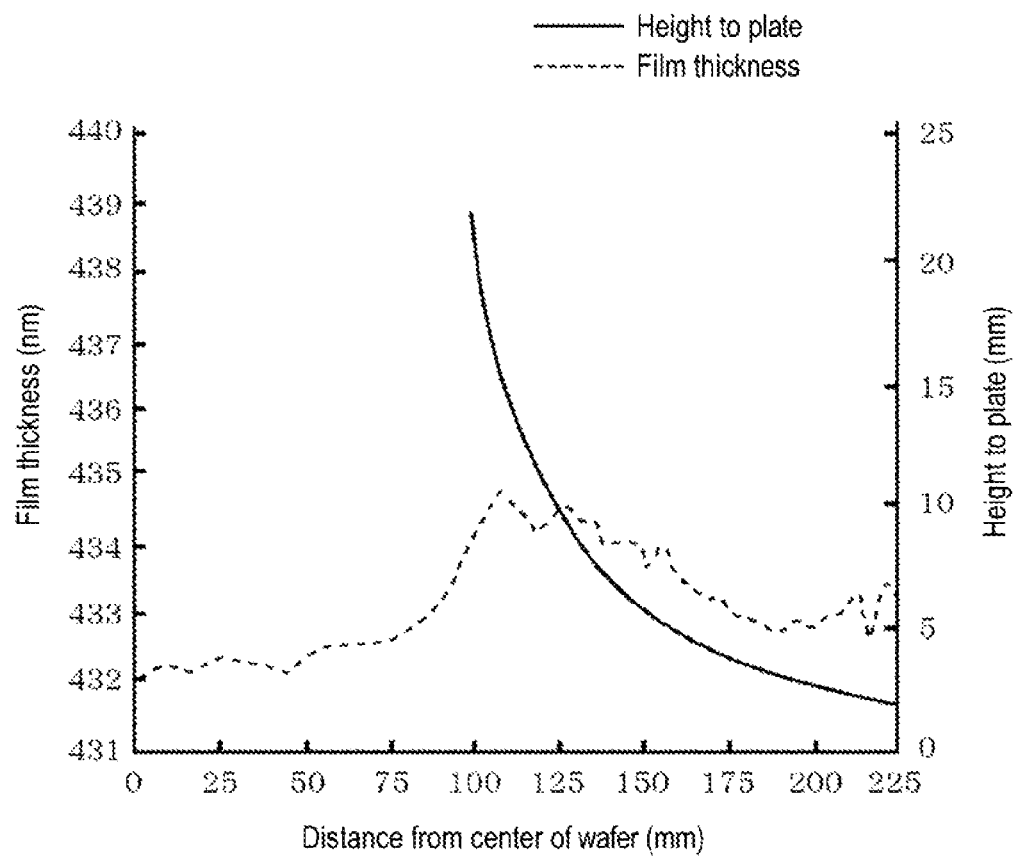
FIG. 29 is a graph representing a result of an evaluation test.

The resist coating apparatus 1 was used to form a resist film on a wafer having a diameter of 450 mm, and the film thickness of the resist film was measured in the diametric direction of the wafer W. The rotational speed of the wafer in the dry process was 1200 rpm. The resist coating apparatus 1 is configured to have the ring plate as illustrated in FIGS. 11 and 12. In other words, the ring plate 61 having the protrusion 62 that was not steep was used in this Evaluation Test 3. A radius of the opening 44 of the ring plate 61 was 100 mm FIG. 29 shows a graph illustrating the results of Evaluation Test 3. The horizontal axis of the graph represents the distance from the center of the wafer W. Vertical axes of the graph represent a film thickness of the resist film and a height from the surface of the wafer W to the bottom surface of the ring plate 61. As shown in the graph, a local rising of the resist film, even in the order of just several nanometers, was found below the inner peripheral edge of the ring plate 61.

Evaluation Test 4

A resist film was formed on a wafer W having a diameter of 450 mm using a resist coating apparatus. As the resist coating apparatus, two types of the resist coating apparatuses were used. One resist coating apparatus had a ring plate including the protrusion 62 that was not steep like the resist coating apparatus used in Evaluation Test 3. A test using this resist coating apparatus is referred as Evaluation Test 4-1. The radius of the opening 44 of the ring plate was 100 mm. The other resist coating apparatus had a ring plate including the protrusion 92 shown in FIG. 20, in which this protrusion 92 was steep. These two resist coating apparatuses were similar to each other except for the configurations of the protrusions. A test using the other resist coating apparatus is referred as Evaluation Test 4-2. The rotational speed in the dry process was changed for each wafer W in both Evaluation Tests 4-1 and 4-2, and the resist films were formed on the plurality of wafers W. Whether there were wind-cut marks on each wafer W or not was checked, and the film thicknesses at a plurality of positions of each wafer W were measured in the diametric direction of the wafer W.

When the rotational speed of the wafer W in the dry process was 800 rpm, 1,000 rpm and 1,100 rpm, no wind-cut mark was found on the wafers W in both Evaluation Tests 4-1 and 4-2. As seen from the result, either of the ring plates can prevent a turbulent flow above the periphery of the wafer W, regardless of whether the protrusion is steep or not.

Figure 30:
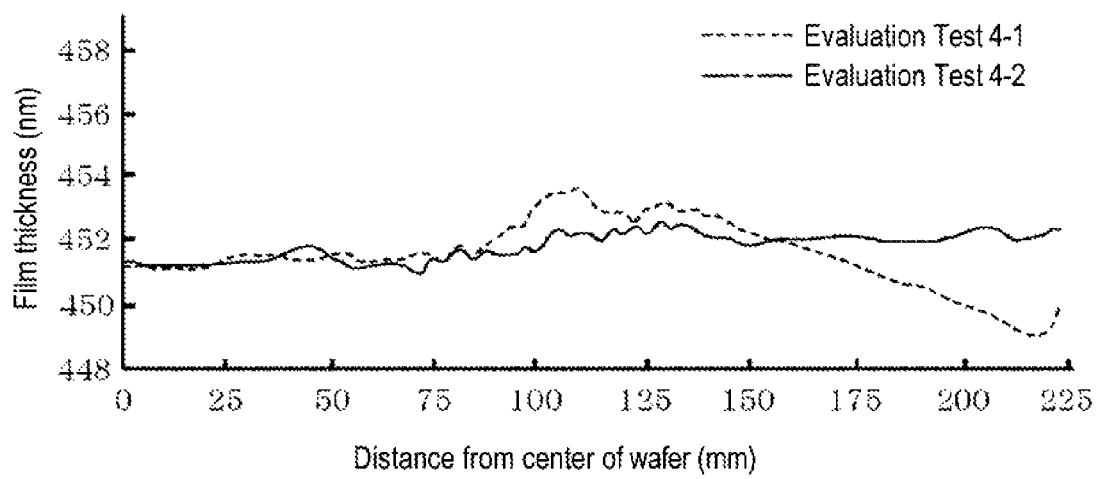
FIG. 30 is a graph representing a result of an evaluation test.

FIG. 30 illustrates a graph showing the film thickness distributions on the wafers W when the rotational speed of the wafer in the dry process was set to 1,100 rpm in Evaluation Tests 4-1 and 4-2. The vertical axis of the graph represents the film thickness while the horizontal axis represents a distance from the center of the wafer W. As shown in this graph, a variation in the film thickness in the diametric direction of the wafer W in Evaluation Test 4-2 was smaller than that in Evaluation Test 4-1. In particular, a local increase in the film thickness was prevented below the inner peripheral edge of the ring plate. Further, when the rotational speed of the wafer W was set to 1,100 rpm, the 3 sigma value of the film thicknesses measured at respective measurement positions of the wafer W was calculated to be 3.4 nm in Evaluation Test 4-1 and 1.1 nm in Evaluation Test 4-2. Accordingly, as can be seen from the results, when the protrusion is steep, an increase in the film thickness below the periphery of the opening of the ring plate can be prevented more surely, thereby enhancing the uniformity in the film thickness in the plane of the wafer W.

Figure 31:
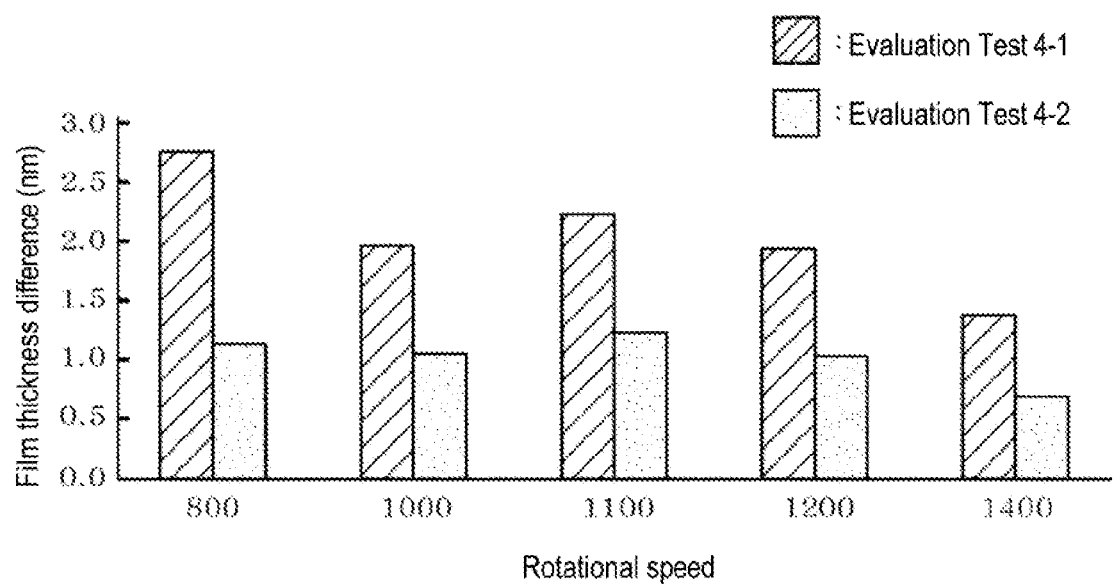
FIG. 31 is a graph representing a result of an evaluation test.

FIG. 31 illustrates a histogram representing results of measuring the film thickness of the wafer W at respective rotational speeds. The vertical axis of the graph represents a maximum value minus a minimum value (expressed as a film thickness difference) of the film thickness measured in the plane of the wafer W. When the rotational speed of the wafer W in the dry process is 800 rpm, 1,000 rpm, 1,100 rpm, 1,200 rpm and 1,400 rpm, the difference in the film thickness measured in Evaluation Test 4-1 is larger than that measured in Evaluation Test 4-2. As can be seen from the results, the uniformity in the film thickness of the wafer W may be enhanced by using the steep protrusion even if the rotational speed in the dry process is changed.

According to the present disclosure, the annular member is provided above the periphery of the substrate held by the substrate holding unit so that the annular member may cover the periphery of the substrate to rectify the gas stream above the periphery of the substrate. Further, the annular member includes a protrusion which protrudes upward along the inner peripheral edge of the annular member. The annular member configured to rectify the gas stream above the periphery of the substrate restrains the turbulent flow from occurring at the periphery of the substrate when the rotational speed of the substrate is increased. Further, the protrusion can reduce a component of the gas stream which is directed directly downward near the inner peripheral edge, and prevent the local rising of the coating film on the substrate near the inner peripheral edge. As a result, throughput can be enhanced and uniformity in film thickness of the coating film can be enhanced.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A coating film forming apparatus, comprising:
   a substrate holding unit configured to horizontally hold a substrate;
   a rotating mechanism configured to rotate the substrate held by the substrate holding unit;
   a coating liquid supplying mechanism configured to supply coating liquid onto the substrate such that a coating film is formed on the substrate;
   an annular member configured to rectify a gas stream above a periphery of the substrate when a liquid film of the coating liquid is dried with a rotation of the substrate, the annular member being provided above the periphery of the substrate and along a circumferential direction of the substrate so as to cover the periphery of the substrate; and
   a protrusion provided on an inner most peripheral edge of the annular member along a circumferential direction of the annular member such that all portions of the protrusion protrudes upward higher than other portions of the annular member to reduce a component of the gas stream flowing directly downward near an inner peripheral edge of the annular member,
   the protrusion including an outer surface facing an outer periphery of the annular member, the outer surface of the protrusion having a slanted surface descending toward an inner periphery of the annular member, or an inwardly recessed portion that is recessed toward an inner periphery of the annular member.

2. The apparatus of claim 1, wherein a difference between a height of a peak portion in an area ranging from the inner peripheral edge of the annular member to a position that is 30 mm distant from the inner peripheral edge toward an outer periphery of the annular member and a height of a lowest portion in a region outside the peak portion in the area is 30 mm or more.

3. The apparatus of claim 1, wherein the slanted surface is a curved surface.

4. The apparatus of claim 1, wherein an upper surface of the annular member ascends from an outer periphery of the annular member toward the protrusion.

5. The apparatus of claim 1, further comprising an elevating mechanism configured to raise and lower the annular member with respect to the substrate,
   wherein the elevating mechanism positions the annular member at a first position when the coating liquid is supplied onto the substrate by the coating liquid supplying mechanism, and
   wherein the elevating mechanism positions the annular member at a second position after the supply of the coating liquid is terminated, the second position being closer to the rotated substrate than the first position.

* * * * *